(12) United States Patent
Creswick

(10) Patent No.: US 6,191,022 B1
(45) Date of Patent: Feb. 20, 2001

(54) FINE PITCH SOLDER SPHERE PLACEMENT

(75) Inventor: Steven B. Creswick, West Lafayette, IN (US)

(73) Assignee: CTS Corporation, Elkhart, IN (US)

( * ) Notice: Under 35 U.S.C. 154(b), the term of this patent shall be extended for 0 days.

(21) Appl. No.: 09/295,101

(22) Filed: Apr. 18, 1999

(51) Int. Cl.[7] .......................... H01L 21/44; H01L 21/48; H01L 21/50; B23K 31/00
(52) U.S. Cl. .......................... 438/612; 438/118; 438/119; 228/180.22
(58) Field of Search .................................... 438/612, 613, 438/118, 119, 14, 614, 615, 616, 617; 228/180.22, 180.1, 179.1, 49.1

(56) References Cited

U.S. PATENT DOCUMENTS

| | | | |
|---|---|---|---|
| 3,719,981 | * | 3/1973 | Steitz ...................................... 29/423 |
| 4,558,812 | | 12/1985 | Bailey et al. . |
| 5,284,287 | | 2/1994 | Wilson et al. . |
| 5,431,332 | * | 7/1995 | Kirby et al. .......................... 228/246 |
| 5,655,704 | * | 8/1997 | Sakemi et al. ........................ 228/246 |
| 5,658,827 | * | 8/1997 | Aulicino et al. ................. 228/180.22 |
| 5,895,554 | * | 4/1999 | Gordon ................................. 156/556 |

* cited by examiner

*Primary Examiner*—Matthew Smith
*Assistant Examiner*—Lex H. Malsawma
(74) *Attorney, Agent, or Firm*—Mark P. Bourgeois; Mark W. Borgman; Albert W. Watkins

(57) ABSTRACT

In forming an interconnection between a component and an electronic circuit, a base with precise component pockets is loaded with components. The components are patterned with a thin layer of solder paste. Next, a frame including a stencil, vertical walls and locating or keying features is placed onto the base. The stencil rests a controlled distance above the components. A multitude of solder spheres are dispensed into the frame. Solder balls retained within the frame are passed through the stencil and into contact with solder paste. Most preferably, due to controlled spacing between the stencil and components, only one solder ball is able to pass through each stencil hole. The remaining solder spheres in the frame are collected through various alternative techniques, including a disclosed emptying gate. Then the frame with stencil is removed from the base. The solder paste and solder spheres are heated, resulting in a reflow of the solder paste and a bonding of the solder spheres to the component. Subsequent processing may also include further reflowing of the solder spheres, cleaning of any residue from the components, and device testing, as appropriate.

21 Claims, 3 Drawing Sheets

FINE PITCH SOLDER SPHERE PLACEMENT

BACKGROUND OF THE INVENTION

1. Field of the Invention

This invention pertains generally to circuit modules and components used as sub-assemblies in the assembly of complex electronic circuits. More specifically, the invention pertains to methods of reliably forming low-cost, high performance, compact electrical interconnections between the sub-assembly and larger electronic circuits.

2. Description of the Related Art

Several goals and objectives are pervasive throughout the electronics industry. Among these are a need for smaller sizes, higher reliability, lower power consumption, lower cost, and faster operating speeds. Many applications are awaiting or would most preferably use a circuit which is small and compact enough to be unobtrusive, while simultaneously offering improved operational capability. However, various ones of these goals are often in opposition to others. For example, size and capability are generally in conflict, and a circuit designer must choose whether a size needed for a given capability is appropriate. If not, the designer must choose what functions or capabilities can be sacrificed in order to keep the desired size. Similar design comparisons and trade-offs must be made with cost, yield, reliability, and so on. As a result, there is a continuing need to develop ways of constructing smaller, more efficient circuits that are still produced with high yields and moderate cost.

In pursuit of these underlying goals, modern circuits are constructed from a number of various sub-assemblies. Each of the sub-assemblies may be tested prior to assembly into the larger circuit, or, alternatively, may be assembled through a removable connection, so that when a sub-assembly is defective or fails, it may be replaced. Even the sub-assemblies are frequently assemblies of smaller devices or components. A primary reason for using sub-assemblies is the underlying device reliability, and the number of devices found in many of today's circuits. Manufacturing yields are dependent upon the reliability of the components used in the assembly of the product. In production of a circuit with thousands of parts, even if the individual components all have a failure rate of only one in one thousand, which is ordinarily considered reliable, the device built from thousands of these components will almost certainly fail, because at least one of the thousands of parts will be a bad one. Consequently, the manufacturer must choose between higher reliability components, which are sold at higher prices, and lower production yields.

In addition to yields, other challenges are significant. The electrical interconnects between a component or sub-assembly and other components or sub-assemblies will have a very significant impact on both the performance and size of the circuit and also upon the ease or difficulty of manufacture and repair. Many different methods have been proposed for making these connections. Yet, as before, each suffer from limitations in one area or another. As circuitry has been developed which operates at higher speeds, there has been a need for making electrical interconnections which are able to carry these high speed signals without significant degradation. Unfortunately, as signal frequencies increase, the length of an electrical conductor becomes very consequential to important characteristics of the conductor, such as cross-talk and line impedance.

To shorten the length of an interconnect, a configuration referred to as fine-pitch has been developed. A fine pitch interconnection will, for the purposes of this disclosure, be defined as an interconnection having spacings of 0.050 inches or less. In the prior art, standard interconnect spacings were at 0.100 inches, which at the time met the requirements of the available circuitry. However, with newer, faster circuits operating at higher frequencies, and with the desire to reduce both cost and size of circuit boards and other device surface area, there is frequently a need for tighter spacings, as is found now in fine pitch spacing.

The fine pitch interconnection, however, necessitates altering previous attachment techniques such as soldering. Previously, wave soldering, IR reflow, hot bar, and other similar techniques were used to make interconnections. Unfortunately, as the pitch decreases, meaning more electrical interconnects in a given space, the more likely solder is to bridge gaps between interconnects. If solder does bridge a gap, an electrical short circuit will result that can easily disable or destroy the functionality of the assembly.

As an alternative to the previous soldering techniques, a method was developed that uses solder balls to form reliable, controlled height electrical interconnections between a component and another component or a circuit substrate. In this method, a solder ball preform is placed onto an electrical connection point or pad. During a subsequent heating phase, the solder melts and reflows, attaching the solder ball to the electrical connection point. The component that now has a solder ball attached to and extending from the electrical connection point may then be placed so that the solder ball extends onto a second electrical connection pad of another device or substrate. The solder is again heated to reflow, leaving a small gap roughly equal to the diameter of the solder ball between the two components. The small gap may be controlled to some extent by use of the solder ball, and the amount of solder applied thereto is very precisely controlled.

The gap may serve a number of different purposes, among the most mundane which is to allow the subsequent cleaning of any flux or other corrosive residue that might have been released during the solder process. During operation of the devices, the solder also acts a small metal bridge. As is apparent, the small metal bridge does offer some resilience, and so any differences in expansion or contraction of the components during operation will, most preferably, be absorbed within the solder ball interconnect. Once two devices have been attached in this manner, they may be treated as a single unit. Nevertheless, if there should arise a need to separate the two components, the solder junction between the components may be melted non-destructively, thereby allowing assembly and, as needed, disassembly.

Unfortunately, in spite of the many advantages of these solder ball interconnects, the balls are quite small and difficult to handle. Production of one or a few parts in a lab is readily achieved, but volume production is much more difficult. Once again, yields of production directly affect manufacturing costs, and the equipment to handle these solder balls has not met the needs of the industry.

Several proposals have been made for handling these solder balls in a production environment, two examples which are illustrated by Bailey et al in U.S. Pat. No. 4,558,812 and Wilson et al in U.S. Pat. No. 5,284,287, the contents which are each incorporated herein by reference. These systems rely upon vacuum to locate the solder balls prior to attachment to a component or subassembly. Since the solder balls are very small, 20–40 thousandths of an inch as referred to by Wilson et al, and potentially smaller in the present invention, the holes that permit passage of vacuum must be smaller yet. Unfortunately, these holes are extremely difficult to clean. Yet, when even a single hole plugs, an interconnect will fail. One of the concerns in fact noted by Wilson et al is the issue of contamination of the vacuum pick-up tool with flux. The size limitation of the vacuum line, and yet the necessity of having it, has prevented the implementation of these solder balls in numerous applications where otherwise the balls would be advantageous.

SUMMARY OF THE INVENTION

In a first manifestation, the invention is a method for fine pitch placement of solder spheres onto components of an assembly. The method comprises the steps of: producing a base with pockets therein; forming a stencil with holes therethrough; adhering the stencil to a frame having elevated walls; inserting components into base pockets; aligning stencil with base so that the stencil is vertically above the base and the frame elevated walls extend vertically from stencil; introducing solder spheres into the frame and onto the stencil; moving solder spheres relative to stencil to pass them through the stencil into position adjacent components; removing stencil and frame from base; and heating the components to adhere said solder spheres thereto.

In a second manifestation, the invention is a guide for locating solder balls relative to sub-assemblies. The guide comprises means for holding and locating sub-assemblies; means for receiving and transiently holding said balls; means for aligning the hopper to holder; and means having passages therethrough for selectively dispensing balls onto the sub-assemblies in a precise geometry.

In a third manifestation, the invention is an apparatus for precisely and repeatably dispensing solder spheres onto components. A base has an array of receptacles adapted for receiving and holding components therein. A lower frame circumscribes the base. A stencil rigidly attaches to an upper surface of the lower frame. The lower frame spaces the stencil a precise distance from said component surfaces. An upper frame rigidly attaches to an upper surface of the stencil and circumscribes the stencil to guide and control solder spheres to the stencil.

OBJECTS OF THE INVENTION

A first object of the invention is to provide a method which will reliably and repeatably form interconnections between components or sub-assemblies and electrical circuits. A second object of the invention is to form these interconnections easily and simply, with a minimum of tooling and equipment expense. Another object of the invention is to enable these interconnections to be used for any of the variety of soldering techniques already known in the art, and not limit the interconnections to only one or a few of the applications available to solder sphere attachment. These and other objects of the invention are achieved in the preferred embodiments illustrated on the attached sheets, and described hereinbelow.

DESCRIPTION OF THE PREFERRED EMBODIMENT

Figure 1:
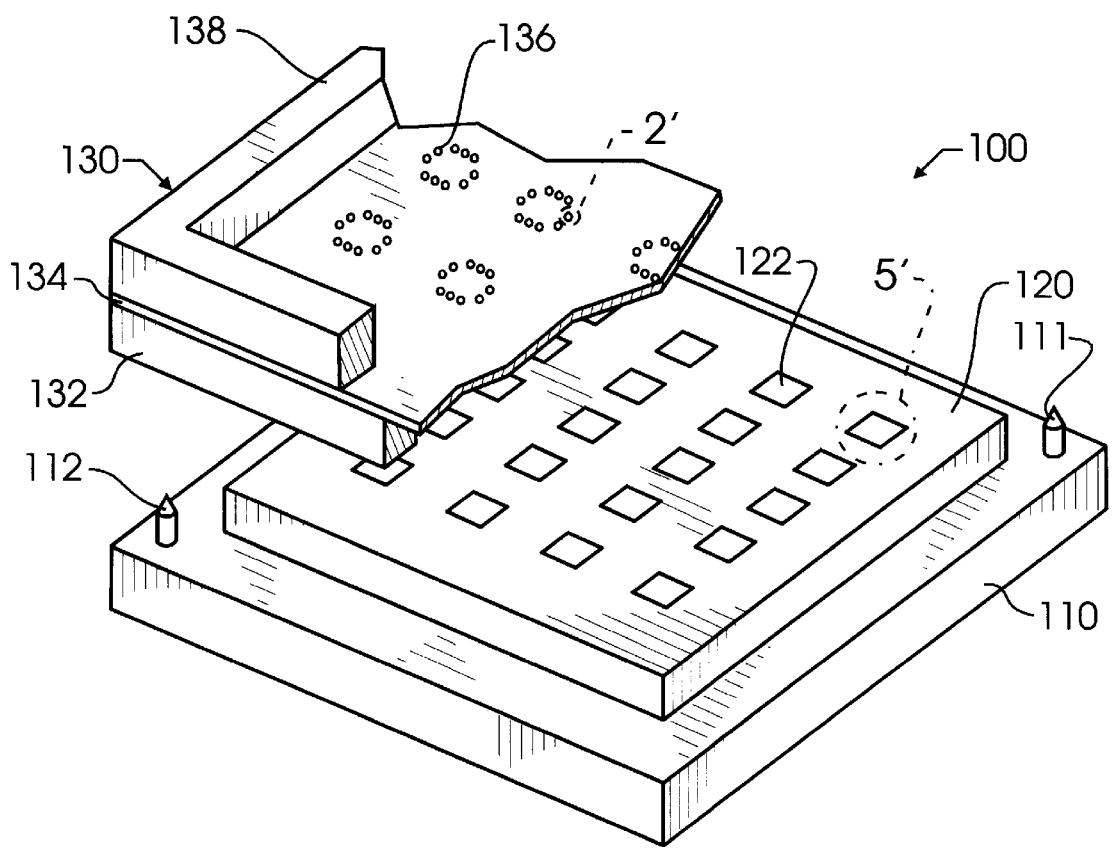
FIG. 1 illustrates a first embodiment of the invention by projected view.
Figure 2:
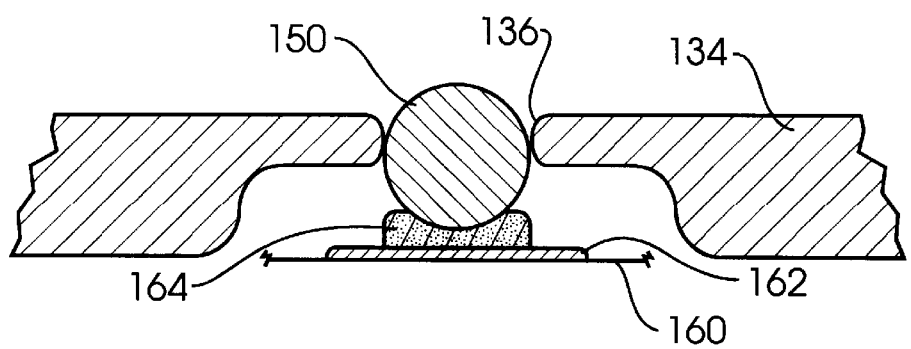
FIG. 2 illustrates a close up of a single solder pad and ball, magnified and sectioned from area 2' of the first embodiment.

A first embodiment guide 100 for fine pitch placement of solder spheres constructed in accordance with the present invention is illustrated in FIGS. 1 and 2. Solder spheres or balls 150 are most preferably placed, poured or otherwise dispensed onto foil stencil 134 and held within frame 130 by top ring 138 and bottom ring 132. Stencil 134 may be made from any suitable material, so long as holes 136 formed through stencil 134 are dimensionally stable and produced with relatively precise diameter and location. Frequently these stencils are produced by chemically etching, punching, or laser machining holes through a foil of ferrous, stainless or other similar alloy. Frame 130 may be held together by glue, welding or any other method which allows stencil 134 to be rigidly attached and precisely placed relative to upper and lower rings 138, 132. Alternatively, the frame 130 can be described as a single piece unit constructed out of metal, graphite, etc.

Frame 130 mates to base 110 through location pins 111, 112, and is preferably keyed to orient in a single direction. For example, pins 111 and 112 may be both offset from exactly opposite corners along the surface of base 110 in the same direction. Reversing base 110 and frame 130 relative to each other would then prevent them from nesting together. Other methods of keying would be acceptable also, and such techniques as varying the sizes of pins 111 and 112 relative to each other have already been contemplated herein.

Onto base 110 a sub-assembly carrier 120 is either formed or mounted, to be rigidly interconnected therewith. Within sub-assembly carrier 120 there are a number of pockets 122 which are designed to precisely carry and locate individual components or sub-assemblies 160, as will be described in greater detail hereinbelow in regard to FIG. 5.

As best seen in FIG. 2, stencil 134 is designed to rest at or just above the top surface of sub-assembly 160. Onto sub-assembly 160 there will typically be a conductive pad or electrical connection point 162. Most preferably, onto electrical connection point 162 there is a controlled amount of solder paste 164 patterned thereon. The patterning may be done through stencils, masks, screen printing, or other such technique, each which are relatively precise in the formation and placement of a solder paste pad. In this preferred method, solder paste 164 has a relatively low melting point, lower than solder sphere 150. Solder ball preform 150, which has a higher melting point than solder paste 164, is sifted through stencil holes 136 by gravity, though this sifting may most preferably be assisted by mild agitation. As solder ball 150 passes through stencil hole 136, it will be placed into and stick to solder paste 164. Excess solder balls will then be removed from within frame 130, without disturbing the placement of solder ball 150 in solder paste 164, by scraping, weak vacuum, displacement to an edge, pouring out of frame 130, or other suitable technique. When stencil 134 is then removed, the remaining solder paste and balls will have precise placement and very precise amounts of solder present. In addition, by using solder paste 164, the need for additional flux may be alleviated. Therefore, solder paste 164 and solder ball 150 are ready for a subsequent heating phase. Alternatively, the frame 130 may remain in place during reflow providing positive control of sphere location during reflow. During this heating, solder paste 164 melts and reflows, attaching solder ball 150 to electrical connection point 162. Sub-assembly 160 now has a solder ball attached to and extending from electrical connection point 162. Sub-assembly 160 may then be placed so that solder ball 150 extends into a second layer of solder paste on a different device or substrate. The second layer of solder paste may then be heated to reflow, leaving a small gap between sub-assembly 160 and a second surface equal to the diameter of solder ball 150 which is spaced between the two components. The small gap may be very precisely controlled by use of solder balls such as solder ball 150.

Figure 3:
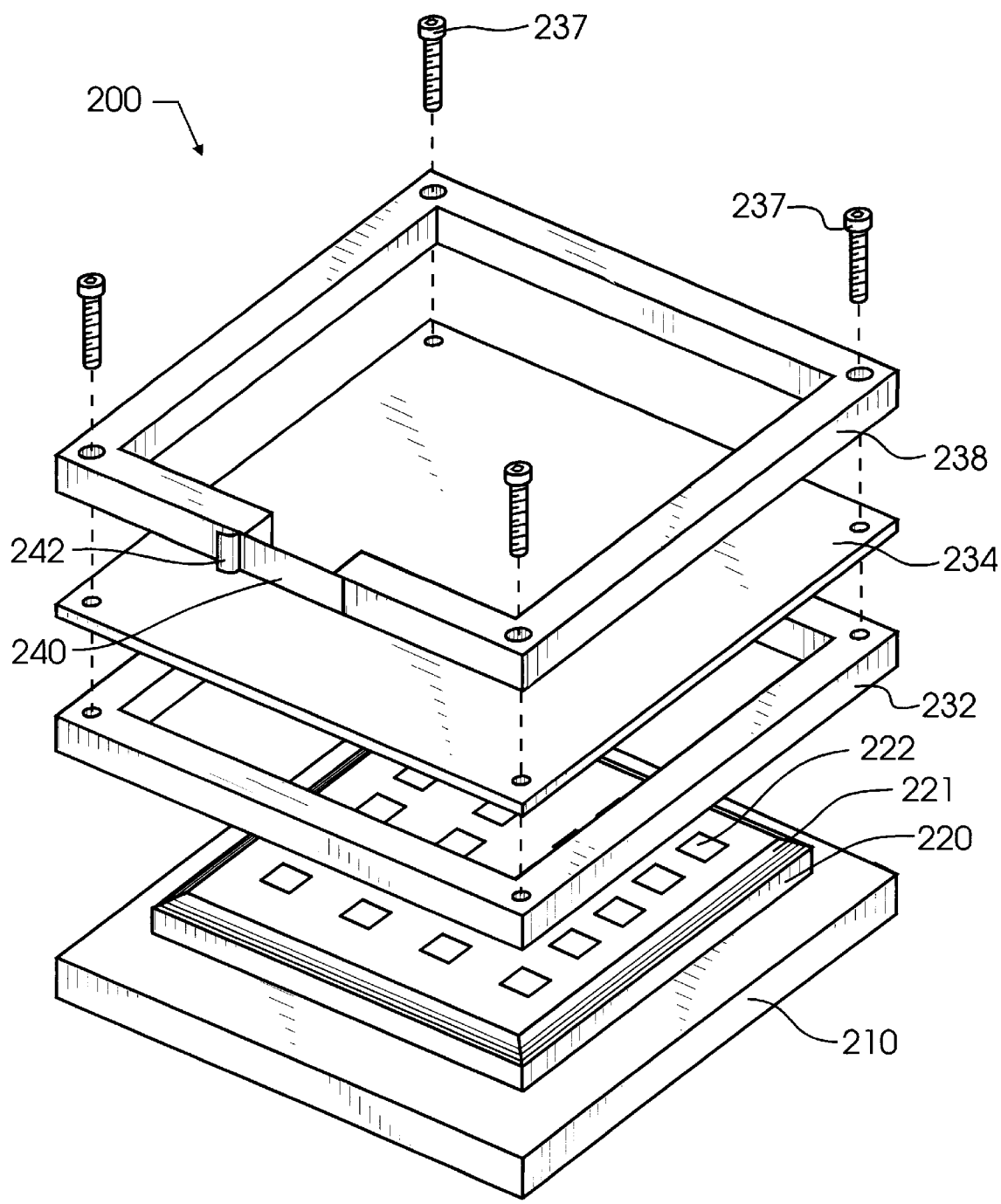
FIG. 3 illustrates a second embodiment of the invention by projected view.

As best illustrated in FIG. 3, a second embodiment guide 200 has a removably attached top ring 238, which is anchored through stencil 234 to bottom ring 232 by four screws 237. Unlike top ring 138, this second embodiment top ring 238 has therein gate 240 having handle actuator 242. Gate 240 may be slide actuated, pivoted, or otherwise moved by devices known in the closure art. Gate 240 serves to close top ring 238 during solder ball 150 placement. Once solder balls 150 have been so placed, excess solder balls 150 are removed from top ring 238 by an operator opening gate 240 and pouring off all remaining balls 150. Provision of gate 240 enables excess solder balls 150 to more readily be removed from top ring 238, without requiring special care or elaborate ball removal equipment. Sub-assembly carrier 220 uses beveled edges 221 and a slightly irregular shape, such as a slight trapezoidal configuration, to accomplish the necessary keying between base 210 and frame bottom ring 232.

Figure 4:
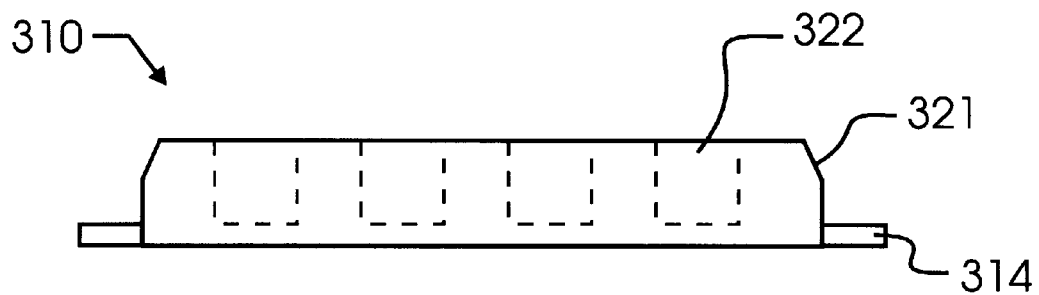
FIG. 4 illustrates a side view of the base of the second embodiment of FIG. 3.

A third embodiment base 310 is illustrated in FIG. 4, having small flanges 314 extending from base 310 only along two of the four edges. In addition, beveled edges 321 are also provided only along two of the top edges of base 310. Pockets 322 will resemble pockets 122 of the previous embodiments, thought they may not extend all the way through a separate carrier.

Figure 5:
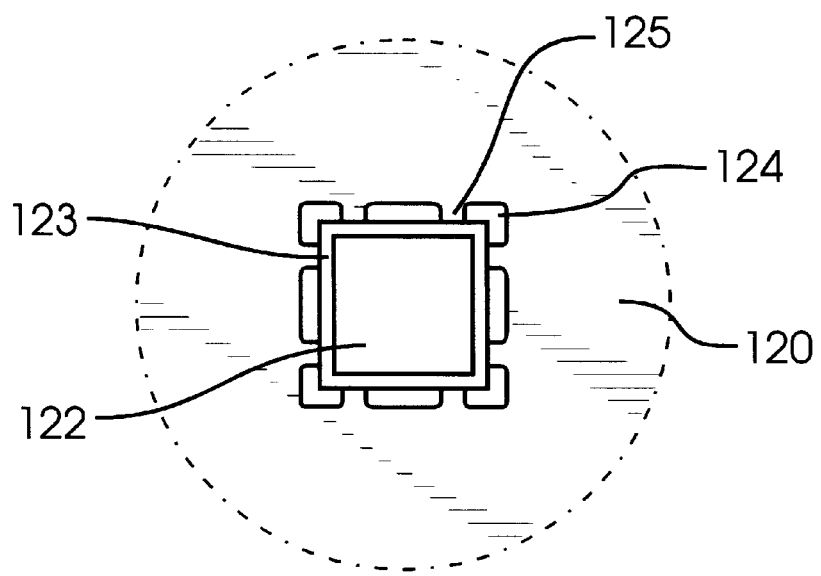
FIG. 5 illustrates a component pocket magnified from the first embodiment FIG. 1.

FIG. 5 illustrates one version of a pocket, in this case pocket 122, though the pocket of FIG. 5 could be used with pocket 222 or pocket 322 as well. As can be seen therein, carrier 120 has a number of small fingers or protrusions 125 which surround a component support surface 123. Component support surface 123 is held by these protrusions 125, or may alternatively be more permanently bonded if holes 124 are filled with adhesive, braze, or other similar bonding compound. Where sub-assembly carrier 120 is removable from base 110, pocket 122 will be open from both sides. In this embodiment, component support surface 123 may also be somewhat elastic or resilient, or, alternatively, component 160 may be slightly elastic or resilient, allowing component 160 to be pressed into component support surface from the bottom side and held by component support surface 123. This can be important for those applications where the electrical connection point surface has features that may be damaged during handling, while the opposite surface is more rugged. Other applications may also require reverse side placement.

While the foregoing details what is felt to be the preferred embodiment of the invention, no material limitations to the scope of the claimed invention are intended. Further, features and design alternatives that would be obvious to one of ordinary skill in the art are considered to be incorporated herein. The scope of the invention is set forth and particularly described in the claims hereinbelow.

I claim:

1. A method for fine pitch placement of solder spheres onto components of an assembly, comprising the steps of:
   a) providing a base with pockets therein;
   b) providing a stencil with holes therethrough that is attached to a frame having elevated walls, said frame and said base being mechanically keyed to orient and physically engage together in a single, precise position;
   c) inserting said components into said pockets;
   d) aligning said stencil with said base by engaging said frame firmly in contact with said base to thereby rigidly position said stencil relative to said frame so that said stencil is vertically above said base by a precise, repeatable distance and said elevated walls extend vertically from said stencil;
   e) introducing solder spheres into said frame and onto said stencil;
   f) moving said solder spheres relative to said stencil to pass a subset of said solder spheres through said stencil into position adjacent said components;
   g) pouring a remainder of said solder spheres that are not a part of said subset of said solder spheres off of said stencil through a gate in said frame;
   h) removing said stencil and frame from said base; and
   i) heating said components to adhere said subset of said solder spheres thereto.

2. The method for fine pitch placement of solder spheres of claim 1 wherein said components comprise ball grid arrays.

3. The method for fine pitch placement of solder spheres of claim 1 wherein said holes in said stencil are formed with fine pitch spacing.

4. The method for fine pitch placement of solder spheres of claim 3 wherein said holes are formed in a pattern which the solder spheres will be placed.

5. The method for fine pitch placement of solder spheres of claim 1 comprising the additional step of patterning solder paste onto said components prior to said step of introducing.

6. The method for fine pitch placement of solder spheres of claim 5 wherein said spheres stick into said solder paste after said moving step.

7. The method for fine pitch placement of solder spheres of claim 1 wherein said step of heating comprises reflowing said solder paste without reflowing said solder spheres.

8. The method for fine pitch placement of solder spheres of claim 1 wherein said step of heating comprises reflowing said solder paste and said solder spheres to form a solder bump.

9. The method for fine pitch placement of solder spheres of claim 1 further comprising the step of removing excess solder spheres from said frame.

10. The method for fine pitch placement of solder spheres of claim 1 wherein said step of pouring comprises the additional steps of:
    opening said gate; and
    tilting said base, frame and stencil to pass said remainder of said solder spheres through said gate.

11. A guide for locating solder balls relative to subassemblies, comprising:
    a) holder means for holding and locating said subassemblies and having a surface of alignment;
    b) hopper means for receiving and transiently holding said balls and having a surface of co-alignment which, when physically mated immediately adjacent with said surface of alignment, provides precise alignment between said holder and said hopper;

c) stencil means having passages therethrough for selectively dispensing said balls onto said sub-assemblies in a precise geometry;

d) a gate through which said balls from said hopper means may pass while said stencil maintains said dispensed balls on said sub-assemblies.

12. The guide of claim 11 wherein said sub-assemblies are spaced from said stencil to allow a single solder ball between said stencil and said sub-assemblies.

13. The guide of claim 11 further comprising solder paste patterned upon said sub-assemblies.

14. The guide of claim 13 further comprising electrical pads upon which said solder paste is patterned.

15. The guide of claim 14 wherein said electrical pads are spaced from each other by less than twenty-thousandths of an inch.

16. The guide of claim 11 wherein said gate opens to said hopper adjacent a plane formed by said stencil means, whereby said solder balls may be poured from said stencil means through said gate under the sole influence of gravitational forces while said stencil means maintains said dispensed balls on said sub-assemblies.

17. An apparatus for precisely and repeatably dispensing solder spheres onto components, comprising:

a) a base having a surface, an array of receptacles adapted for receiving and holding components therein, each component having a surface with electrical connection points thereon;

b) a lower frame circumscribing said base and configured for mechanical engagement with said base in a single unique relationship and wherein said lower frame is removable from said base and may be removed and reattached repeatedly in alignment with said base, wherein said alignment is ensured by said mechanical engagement;

c) a stencil rigidly attached to an upper surface of said lower frame, said lower frame spacing said stencil a precise distance from said component surfaces; and d) an upper frame rigidly attached to an upper surface of said stencil and circumscribing said stencil to guide and control said solder spheres to said stencil.

18. The apparatus for precisely and repeatably dispensing solder spheres onto components of claim 17 further comprising flanges on said base against which said lower frame rests.

19. The apparatus for precisely and repeatably dispensing solder spheres onto components of claim 17 further comprising a gate in said upper frame which controls passage of said solder spheres from said upper frame and said stencil away therefrom.

20. The apparatus for precisely and repeatably dispensing solder spheres onto components of claim 17 further comprising:

a plurality of protrusions extending from said base in a non-symmetrical pattern;

a set of indentations in said lower frame complementary to said plurality of protrusions and having a complementary non-symmetrical pattern to said base protrusion non-symmetrical pattern; and a gate enclosing an opening in said upper frame, said gate extending from adjacent said stencil in a direction normal to said stencil by an amount equal to an amount said upper frame extends from adjacent said stencil in a direction normal to said stencil.

21. The apparatus for precisely and repeatably dispensing solder spheres onto components of claim 17 wherein said receptacles further comprise an irregular opening within said base and a resilient liner inserted within said regular opening, said resilient liner having a regular opening for receiving said components therein.

* * * * *